United States Patent [19]
Dent

[11] Patent Number: 5,180,993
[45] Date of Patent: Jan. 19, 1993

[54] METHOD AND ARRANGEMENT FOR FREQUENCY SYNTHESIS

[75] Inventor: Paul W. Dent, Stehag, Sweden

[73] Assignee: Telefonaktiebolaget L M Ericsson, Stockholm, Sweden

[21] Appl. No.: 804,609

[22] Filed: Dec. 10, 1991

Related U.S. Application Data

[63] Continuation-in-part of Ser. No. 633,981, Dec. 26, 1990, abandoned.

[30] Foreign Application Priority Data

Jan. 15, 1990 [SE] Sweden ................................ 9000137

[51] Int. Cl.$^5$ .............................................. H03L 7/197
[52] U.S. Cl. ..................................... 331/16; 331/1 A; 331/17; 331/25; 455/260
[58] Field of Search .................... 331/1 A, 16, 17, 18, 331/25; 455/260

[56] References Cited

U.S. PATENT DOCUMENTS 4,935,707 6/1990 Irwin ..................................... 331/16

Primary Examiner—David Mis
Attorney, Agent, or Firm—Burns, Doane, Swecker & Mathis

[57] ABSTRACT

In a fractional-N frequency synthesizer, the phase error signal is amplified with a factor N prior to adding or subtracting the correction value. This procedure is simpler than the procedure of multiplying the correction value by the factor 1/N. For instance, the phase error signal can be amplified in a separate means, such as an analogue multiplier or a multiplying digital-analogue converter. Amplification can also be effected in conjunction with forming the phase error signal, e.g., by amplifying currents in a so-called charging pump. Amplification of the phase error signal also affords the advantage that loop amplification, loop damping factor and loop band width are held constant. These parameters would otherwise be dependent on 1/N, as a result of varying the frequency. The foregoing technique may also be applied in conjunction with a further technique that allows the loop bandwidth of the frequency synthesizer to be varied. Proportional and integral control currents are produced and compensated for fractional-N ripple and are applied to different input points on a loop filter to obtain an output voltage to control the frequency of a voltage controlled oscillator.

6 Claims, 5 Drawing Sheets

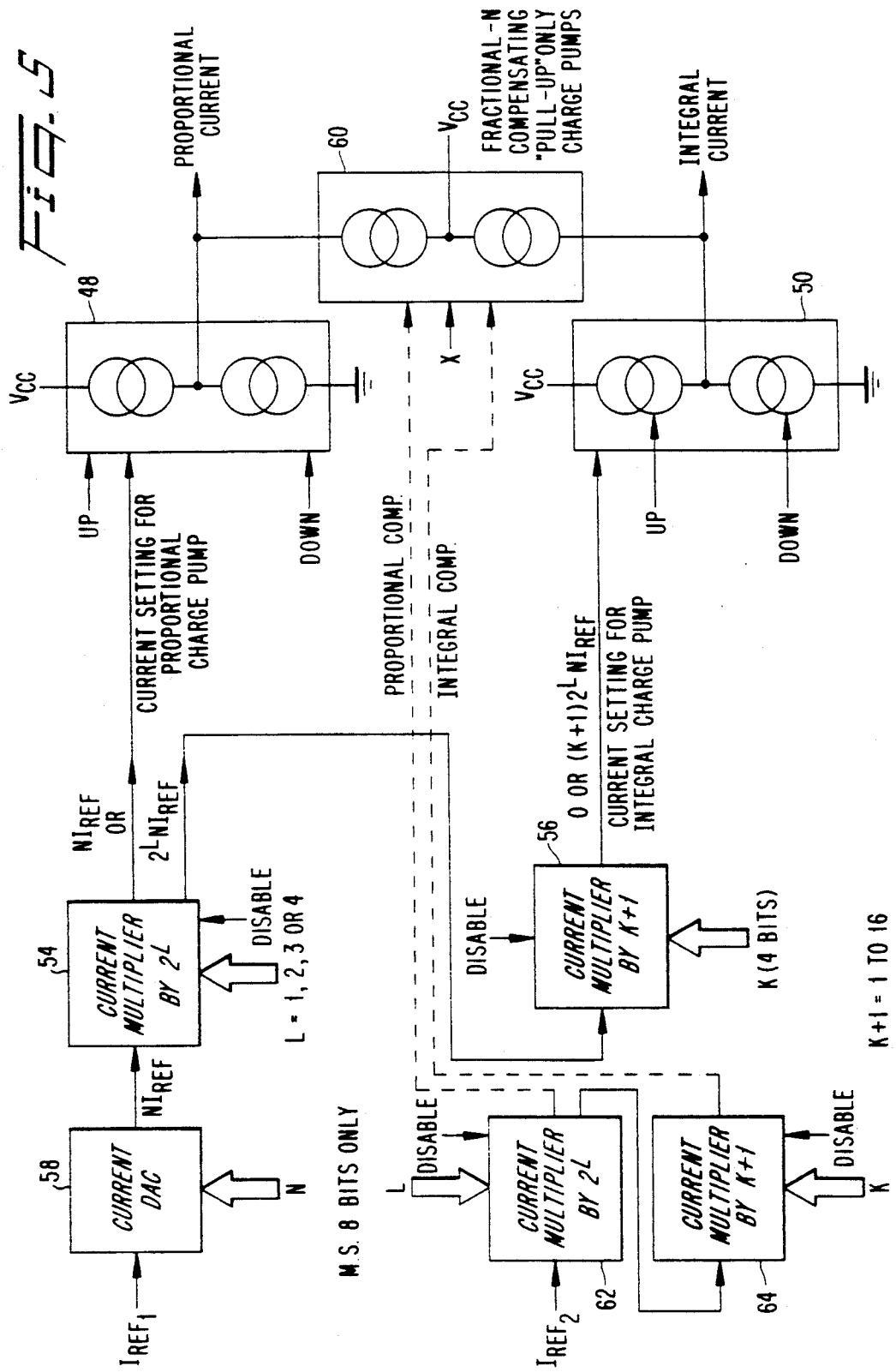

METHOD AND ARRANGEMENT FOR FREQUENCY SYNTHESIS

RELATED APPLICATIONS

The present application is a continuation-in-part of Ser. No. 633,981, filed on Dec. 26, 1990, now abandoned.

BACKGROUND OF THE INVENTION

1. Technical Field

The invention relates to frequency synthesis with a controlled oscillator incorporated in a phase-locked loop, in which the frequency of the oscillator output signal is divided periodically with mutually different integers, such that the frequency is, on average, divided by a value which is equal to an integer N plus or minus a numerical fraction whose absolute value is smaller than one. The phase position of pulses generated in this way is compared with the phase position of pulses which originate from a reference signal, therewith forming a phase error signal. In order to suppress periodic variations occurring in a control signal to the oscillator due to phase jitter in the loop, there is added to or subtracted from the phase error signal an accumulated correction value which is dependent on said fraction.

2. Prior Art

In practice, it is often not possible to change the frequency in sufficiently small increments in a frequency synthesizer in which the frequency of the output signal is only divided with one single integer for each possible, lockable frequency. This is because the smallest frequency increment or step between two lockable frequencies is equal to the frequency at which phase position comparisons are carried out when generating the phase error signal. Consequently, when small frequency increments are desired, it is necessary to carry out the phase position comparisons at a frequency which is so low that the loop locking time is unacceptably long during the frequency changes.

In the case of a frequency synthesizer in which the output signal frequency is divided periodically with an integer in the manner described in the introduction, the phase position comparisons can be carried out at a frequency which is higher than the smallest increment magnitude during the frequency changes UK Patent Specification 1560233 describes a frequency synthesizer which operates in accordance with this principle. With a frequency synthesizer of this kind, phase jitter occurs in the phase-locked loop due to the fact that the oscillator frequency is divided periodically with a numerical integer, e.g., the numeric values N and N+1. The magnitude of this jitter is at maximum one period of the oscillator output signal, i.e., $2\pi$ radians. The maximum jitter is reduced to $2\pi/N$ of the pulses generated when the frequency of the oscillator signal is divided down. This means that the correction value added to or subtracted from the phase error signal must be multiplied by a factor which is proportional to 1/N. It is difficult in practice, however, to achieve sufficient accuracy in multiplication by the inverted value of N for a number of different integers N.

SUMMARY OF THE INVENTION

When practicing the present invention, no multiplication is effected with a factor which is proportional to 1/N in order to form the correction value. Instead, the phase error signal is amplified with a factor N prior to adding or subtracting the correction value. This procedure is simpler than the procedure of multiplying the correction value by the factor 1/N. For instance, the phase error signal can be amplified in a separate means, such as an analogue multiplier or a multiplying digital-analogue converter. Amplification can also be effected in conjunction with forming the phase error signal, e.g., by amplifying currents in a so-called charging pump. Amplification of the phase error signal also affords the advantage that loop amplification, loop damping factor and loop bandwidth are held constant. These parameters would otherwise be dependent on 1/N, as a result of varying the frequency. The foregoing technique may also be applied in conjunction with a further technique that allows the loop bandwidth of the frequency synthesizer to be varied. Proportional and integral control currents are produced and compensated for fractional-N ripple and are applied to different input points on a loop filter to obtain an output voltage to control the frequency of a voltage controlled oscillator.

BRIEF DESCRIPTION OF THE DRAWINGS

The invention will now be described in more detail with reference to the accompanying drawings, in which FIG. 5 illustrates an exemplifying second embodiment of an inventive frequency synthesizer.

DETAILED DESCRIPTION OF THE PREFERRED EMBODIMENTS

Figure 1:
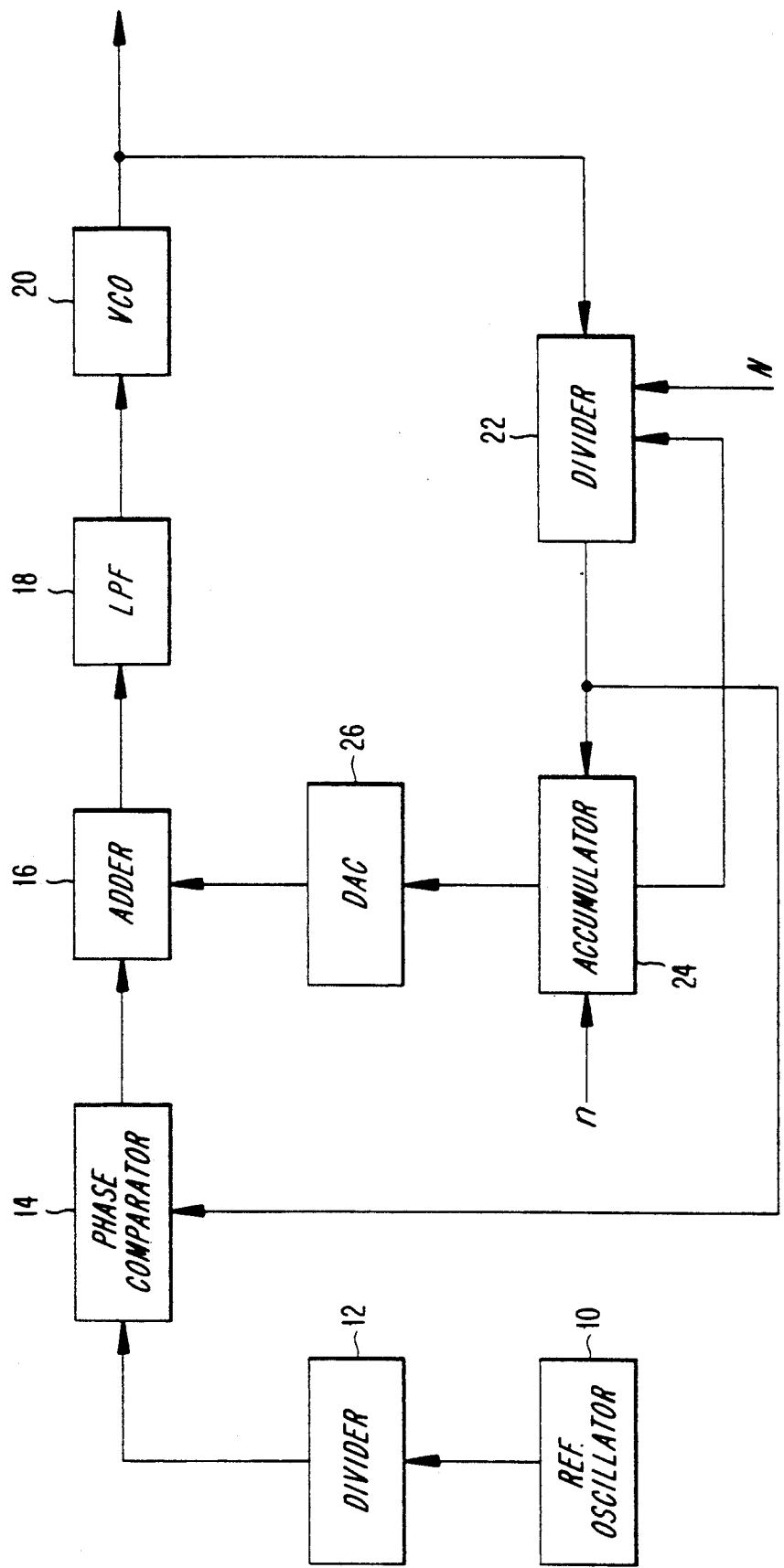
FIG. 1 illustrates a known frequency synthesizer.

FIG. 1 illustrates an example of a frequency synthesizer which operates essentially in accordance with the principle described in the aforesaid UK Patent Specification 1560233. The reference numeral 20 identifies a controlled oscillator, e.g., a so-called VCO, which generates an output signal of variable frequency. The oscillator 20 is included in a phase-locked loop, which also includes a controlled division means 22, in the form of a counter, a phase comparing means 14 and a lowpass filter 18. The frequency of the oscillator output signal is divided periodically in the division means 22 by at least two different integers, for example the numerical values N and N+1. For instance, if the frequency is divided by the number N three times out of four, and by N+1 one time out of four, the frequency will be divided on average by a value N plus the fraction ¼.

When dividing the frequency, there are formed pulses whose phase positions are compared in the comparator means 14 with the phase positions of pulses supplied from a reference oscillator 10, through a division means 12. As will be evident from the aforegoing, periodic variations of the phase error signal formed by the means 14 will occur, owing to that the fact that the time distance between the reference pulses from the division means 12 is constant whereas the time distance between the pulses from the division means 22 will vary. The mean pulse frequency of the pulses from the means 22, however, is equal to the pulse frequency of the pulses from the means 12. In order to avoid also periodic variation of the control signal delivered to the oscillator 20, there is formed a correction value which is added to or subtracted from the phase error signal in an addition means 16.

The fraction by which the mean division value deviates from the integer or whole number N is hereinafter designated D. The correction value is formulated by accumulating the fraction n in a digital accumulating means 24 for each pulse appearing from the division means 22. The accumulated sum is converted to analogue form in a digital-analogue converter 26, whereafter this sum is added to or subtracted from the phase error signal in the addition means 16. When the accumulated sum exceeds the value 1 there is produced a pulse which is delivered to the division means 22 in order to temporarily change the division number N to N+1 for instance. The division means 22 will therewith count N+1 pulses from the oscillator 20 before delivering the next pulse to the phase comparison means 14 and to the accumulating means 24. At the same time, the accumulated sum is decreased by the value one, whereafter a new sequence can begin.

As beforementioned, the maximum phase jitter of the pulses arriving from the division means 22 is proportional to the inverted value of the numeric value N, and accordingly the correction value supplied to the addition means 16 must also be multiplied by 1/N. This can be achieved, for instance, by adjusting the amplification of the digital-analogue converter for each new value of the division number N, or by multiplying the fraction value n by the inverted value of N.

Figure 2:
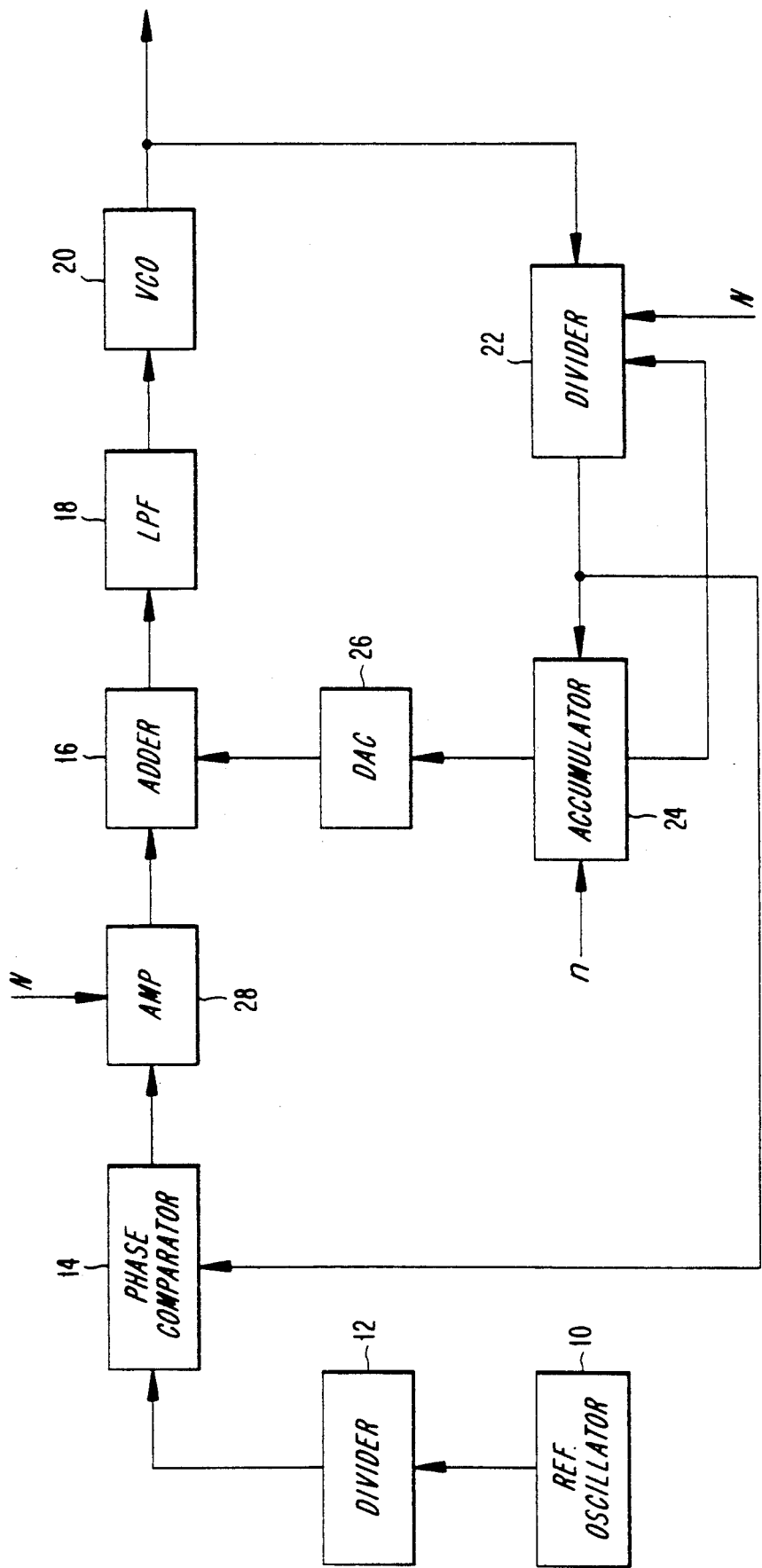
FIG. 2 illustrates an exemplifying first embodiment of the inventive frequency synthesizer.

FIG. 2 illustrates an exemplifying embodiment of a frequency synthesizer constructed in accordance with the present invention. The embodiment illustrated in FIG. 2 includes an amplifying means 28 which is additional to the means or components in the synthesizer illustrated in FIG. 1. The function of the amplifying means 28 is to amplify the phase error signal arriving from the phase comparison means 14 with a factor N, prior to adding or subtracting the correction value.

Because the phase error signal is made proportional to the numeric value N there is no need to make the correction value proportional to the inverted value of N, which is an advantage in comparison with the known synthesizer. Furthermore, loop amplification, damping and bandwidth are also held constant. Frequency division in the division means 22 would otherwise cause these values to vary with changing N.

The amplifying means 28 may, for instance, comprise an analogue multiplier, a multiplying digital-analogue converter, or a programmable attenuation means.

Figure 3:
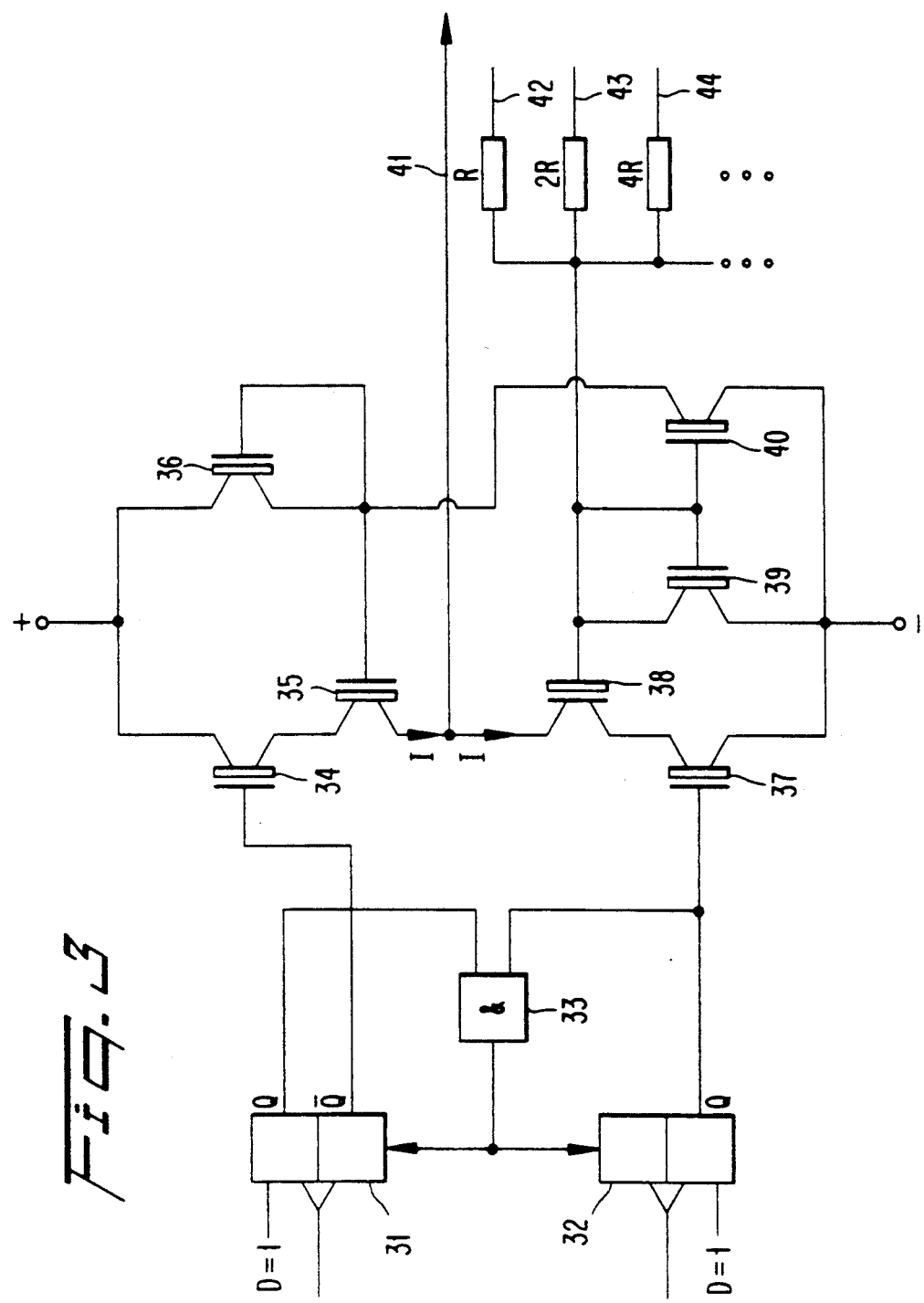
FIG. 3 illustrates an exemplifying embodiment of a phase comparing and amplifying means which is intended to be incorporated in a frequency synthesizer constructed in accordance with the embodiment of FIG. 2.

FIG. 3 illustrates an exemplifying embodiment of a phase comparing means and an amplifying means which are combined to form one single device. This device is intended to replace the means 14 and 28 of the FIG. 2 embodiment. The device includes two D-flip-flops 31, 31, which receive on each of their clock inputs the pulses from a respective pulse train. The flip-flops and an AND gate 33 generate signals which activate two current mirrors. One current mirror is of the P-type and consists of P-type field effect transistors referenced 34-36. The other current mirror is of the N-type and consists of N-type field effect transistors referenced 37-40. The current mirrors function as two pulse-controlled current generators, of which one, when activated, delivers a positive current I and the other, when activated, delivers a negative current I to a common output line 41. In this way, it is possible to increase or decrease the charge on an integration capacitor over time periods that are dependent on the phase difference between the two pulse trains. For instance, if the pulses deriving from the reference oscillator 10 lie in front of the pulses deriving from the controlled oscillator 20, the capacitor shall be charged over that period of time which lapses from the time that a pulse occurs in the pulse train deriving from the reference oscillator to the time at which a pulse occurs in the pulse train deriving from the controlled oscillator. Because the capacitor is charged, the control voltage of the oscillator 20 will increase and therewith result in an increase in the frequency.

The amplitude of the pulsated currents I supplied respectively to and from the line 41 can be controlled with the aid of digital words on a number of inputs 42, 43, 44, etc. . . . These inputs are connected to a number of binary weighted resistors having the resistance R, 2R, 4R, etc. . . . Desired amplification with the numeric value N can be achieved by applying this value in binary form to the input 42-44, etc., wherewith the phase error signal will be proportional to N.

It will be understood that the invention can also be applied in conjunction with frequency division integer combinations other than the numeric values N and N+1, for instance with the numeric value N−1. Furthermore, the aforedescribed amplification can be effected with a factor which is proportional, for instance, to the numeric value N+1 instead of the numerical value N.

It is useful to be able to vary the loop bandwidth of the frequency synthesizer according to whether the frequency synthesizer is operating in an acquisition mode, such as when a new frequency command has just been input, or a tracking mode in which the phase-locked loop of the frequency synthesizer has already locked to the desired frequency. Details of how such a phase-locked loop having a variable bandwidth may be achieved may be found in U.S. Pat. No. 5,106,783 issued Apr. 21, 1992, incorporated herein by reference. Briefly, referring to FIG. 4, a common phase detector 46 feeds two separate charge pumps 48 and 50 to switch their positive or negative current sources on or off, thus generating two streams of current pulses of controllable magnitude.

The stream of current pulses from the "Integral" charge pump 50 goes only into the loop integrator capacitor 52 and thus produces a voltage across the capacitor proportional to the integral of this current. The stream of current pulses from the "Proportional" charge pump 48 flows through the loop damping resistor 54 thus producing a voltage proportional to its current added to the capacitor voltage. In actuality, the proportional current also flows through the capacitor 52 such that the voltage on the capacitor 52 is proportional to the integral of the sum of the Integral and Proportional currents. This, however, does not change the fundamental principle that the total control voltage delivered to the VCO is the sum of a component proportional to the integral of phase error and a component proportional to the phase error, the proportions being independently variable by varying the current levels of the proportional and integral charge pumps appropriately. For the latter purpose, control signals $CTL_P$ and $CTL_I$ are provided to the proportional charge pump 48 and the integral charge pump 50, respectively, from a control device (not shown).

As set forth in the previously-reference application, the purpose of being able to vary the integral and proportional currents is in order to vary the loop bandwidth between a wide value to allow fast settling from a programmed frequency change and a narrow value that holds the loop locked but with reduced loop noise compared to the wide value. At the same time, desirable loop damping is achieved in both bandwidth modes, and a potential "glitch" on transitioning between modes is avoided.

Figure 4:
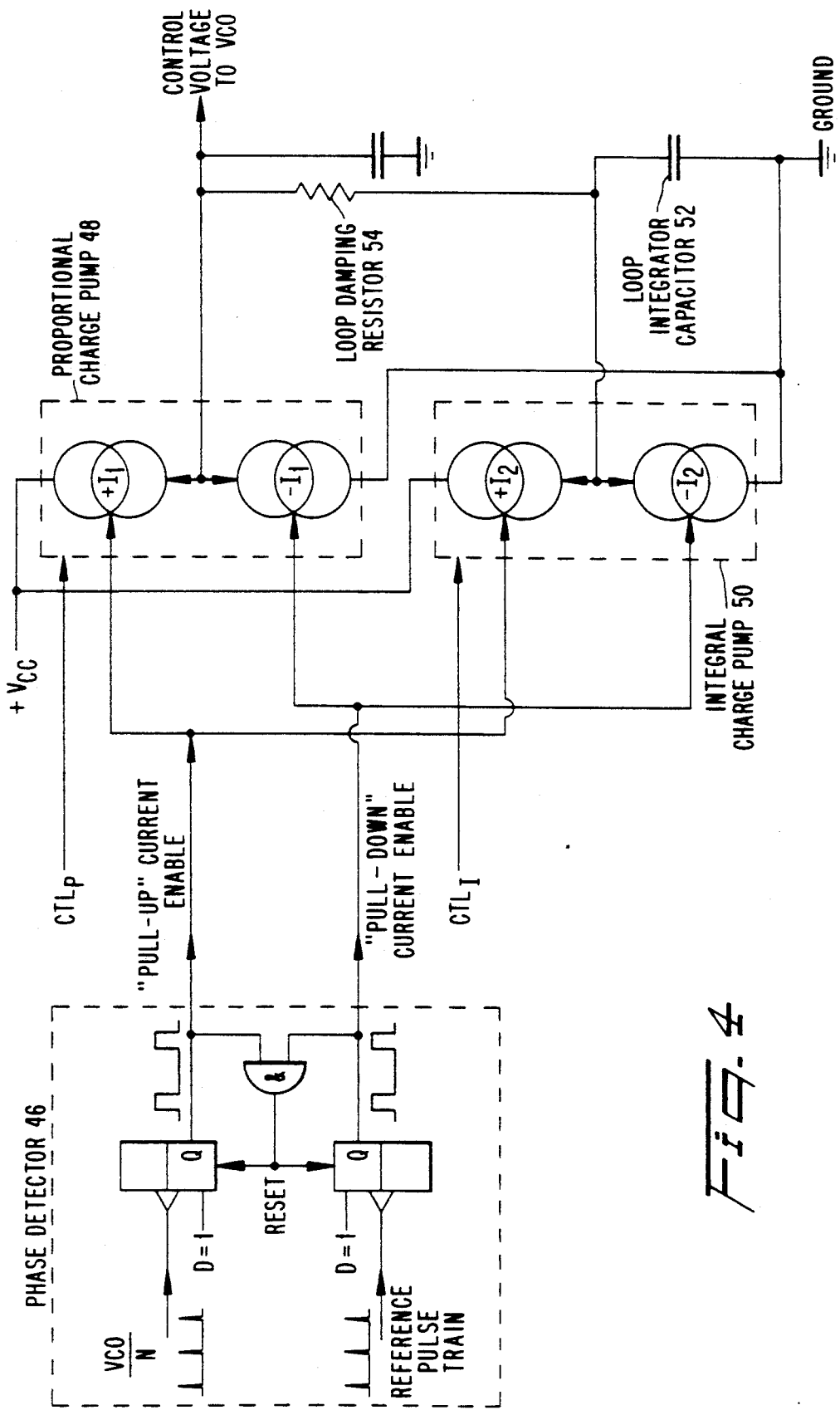
FIG. 4 illustrates a frequency synthesizer in which a variable bandwidth may be achieved.

The technique of FIG. 4 with its resulting advantages may be applied to the fractional-N frequency synthesizer of the present invention in a manner to be presently described in reference to FIG. 5. As in FIG. 4, a proportional charge pump 48 and a integral charge pump 50 are separately provided to produce a proportional control current and an integral control current. As in FIG. 4, in which loop bandwidth changes may be achieved by varying the control signals $CTL_P$ and $CTL_I$, in FIG. 5 loop bandwidth changes are achieved by programming current multiplying constants K and L. A current multiplier 54 that produces the current setting for the proportional charge pump 48 performs a multiplication by $2^L$ where L=1, 2, 3, or 4. The current multiplier 56 that produces the current setting for the integral charge pump perform a multiplication by K+1 where K+1=1 to 16. The current multipliers 54 and 56 may be enabled or disabled according to a DISABLE signal input to both current multipliers 54 and 56. If the current multiplier 54 for the proportional charge pump is disabled, it multiplies by unity an input current. If the current multiplier 56 for the integrating charge pump is disabled, however, it multiplies the current setting for the proportional charge pump, input to the current multiplier 56 for the integral charge pump from the current multiplier 54 for the proportional charge pump, by zero.

In the normal, narrow loop bandwidth mode, DISABLE is set to true such that the multiplication factors L and K have no effect. To obtain a wide loop bandwidth for accelerated settling after a frequency change, DISABLE is made false in order to apply the multiplication factors L and K. In a preferred embodiment, the DISABLE signal is generated from a strobe pulse that loads the final control bits programming a new frequency into the frequency synthesizer. Wide loop mode is thus selected synchronously with loading of the new demand frequency, and remains selected as long as the strobe remains high. The length of time the strobe remains high may be controlled by the user depending on the particular application.

As in FIG. 2, amplification of the phase error signal by a factor of N is also performed. This amplification is accomplished in FIG. 5 by multiplying the reference current $I_{REF1}$ by N in a current digital-to-analogue converter 58 to produce a current $NI_{REF1}$ which is input to the current multiplier 54 for the proportional charge pump. In a preferred embodiment, if N is a number greater than can be represented using 8 bits, as will often be the case, then only the most significant 8 bits of the corresponding digital value are used to perform the multiplication. The currents from both the proportional and integral charge pumps 48 and 50 are therefore made proportional to the overall scaling factor N, represented by the most significant 8 bits of the frequency as indicated by the number the synthesizer's variable divider is programmed to divide by.

When the synthesizer employs fractional-N techniques, fractional-N ripple will exist on both the proportional output current and, if enabled, on the integral output current. Therefore fractional-N compensation currents are required for both charge pumps 48 and 50. It is not sufficient to add some kind of net compensation current to one or other alone, because the proportional and integral currents are subjected to different frequency responses through the loop filter. A compensation current for the proportional charge pump 48 must be subjected to the same loop filter frequency response as the proportional current itself, while a compensation current for the integral charge pump must be subjected to the same frequency response as the integral current. This can only be guaranteed if the compensating currents enter the loop filter at the same points as the proportional and integral currents respectively, requiring two separate compensation currents to be generated. Moreover, the compensating currents cannot remain constant but must be programmed to follow the explicitly desired loop bandwidth changes the present invention aims to achieve by programming the current multiplying constants K and L. Thus the proportional compensation current must be subject to a multiplication by either 1 or $2^L$ like the proportional current itself, while the integral compensation current must be subject to multiplication by $(K+1)2^L$ like the integral current itself.

The compensating currents in this implementation need only ever pull up, corresponding to the fractional-N ripple current, which only has a pull-down direction. This is because the true desired frequency N+n times the reference frequency is always equal to or higher than the frequency represented by the whole part N only that the variable divider is programmed with. A pair of charge pumps 60 is therefore provided, both of the charge pumps being of the pull-up type, a first charge pump forming a fractional-N ripple compensation current pulse generator for the proportional control current and being connected to a same circuit node as the output of the proportional charge pump 48, and a second charge pump forming a fractional-N ripple compensation current pulse generator for the integral control current and being connected to a same circuit node as the output of the integral charge pump 50. To program the compensating currents to follow the desired loop bandwidth changes as previously described, a current multiplier 62 (analogous to the current multiplier 54) multiplies a reference current $I_{REF2}$ by unity or $2^L$ depending on the DISABLE signal, and a current multiplier 64 (analogous to the current multiplier 56) multiplies the output current of the current multiplier 62 by 0 or K+1 depending on the DISABLE signal.

The reference current $I_{REF2}$ is set relative to reference current $I_{REF1}$ such that ripple compensation is achieved at a single test frequency. The current multiplier arrangements then ensure that compensation correctly tracks with frequency changes.

The compensating current waveshape must be generally of sawtooth form, consisting of stepwise incrementing current pulses from zero up to a maximum proportional to the proportional and integral compensation reference currents, before falling back to zero and repeating.

In the preferred implementation, the compensating current staircase-like increments are provided by controlling the pulse width in increasing steps of a basic period of the reference frequency so that the mean current averaged over the pulse repetition period exhibits the desired stepwise incrementing form. This varying pulse width signal is applied at the point X in FIG. 5 to enable the compensation charge pumps to generate the desired pulse width.

According to the foregoing arrangement, compensation currents to eliminate fractional-N ripple are applied to both the proportional and integral charge pumps. Moreover, as the charge pump currents are varied in order to obtain a change in bandwidth from narrow to wide and back again, the fractional-N compensation currents are also varied in the same proportion.

It will be apparent to those of ordinary skill in the art that the present invention may be embodied in other specific forms without departing from the spirit or essential character thereof. The presently disclosed embodiments are therefore intended in all respects to be illustrative and not restrictive. The scope of the invention is indicated by the appended claims rather than the foregoing description, and all changes which come within the meaning and range of equivalents thereof are intended to be embraced therein.

What is claimed is:

1. A fractional-N frequency synthesizer comprising:
an accumulator that is incremented by a value representing a fractional part of a desired frequency;
a variable divide-by-N circuit that is caused to divide by $N_1$ a defined proportion of the time and by $N_2$ a remaining portion of the time;
a phase comparator for comparing an output pulse train from said variable divider with a reference frequency pulse train to produce phase error pulses proportional in width to a timing difference between said pulse trains;
a first charge pump driven by said phase error pulses and producing first current pulses proportional in width to said phase error pulses and proportional in magnitude to a first programming current, said first current pulses being one of pull-up and pull-down current pulses;
a second charge pump driven by said phase error pulses and producing second current pulses proportional in width to said phase error pulses and proportional in magnitude to a second programming current, said second current pulses being one of pull-up and pull-down current pulses;
a first fractional-N ripple compensation current pulse generator producing pull-up current pulses proportional in width to contents of said accumulator and proportional in magnitude to a third programming current, an output of said first fractional-N ripple compensation current pulse generator being connected to a same circuit node as an output of said first charge pump such that said pull-up current pulses are added to said first current pulses to obtain a compensated proportional control circuit;
a second fractional-N ripple compensation current pulse generator producing pull-up current pulses proportional in width to contents of said accumulator and proportional in magnitude to a fourth programming current, an output of said second fractional-N ripple compensation current pulse generator being connected to a same circuit node as an output of said second charge pump such that said pull-up current pulses are added to said second current pulses to obtain a compensated integral control circuit; and
a loop filter having different input points to which respective ones of said compensated proportional control current and said compensated integral control current are applied to obtain an output voltage for controlling the frequency of a voltage controlled oscillator.

2. The apparatus of claim 1 wherein $N_2 = N_1 + 1$.

3. The apparatus of claim 2 further comprising first current multiplier means receiving a first reference current and a disable signal and producing as said first programming current a current N times as great as said first reference current when said disable signal is of one state and a current $2^L N$ times as great as said first reference current when said disable signal is of another state where L is an integer in the range 1 to 4 inclusive.

4. The apparatus of claim 3 further comprising second current multiplier means receiving said first programming current and said disable signal and producing as said second programming current a zero current when said disable signal is of said one state and a current $K+1$ times as great as said first programming current when said disable signal is of said another state where $K+1$ is an integer in the range 1 to 16 inclusive.

5. The apparatus of claim 4 further comprising third current multiplier means receiving a second reference current and said disable signal and producing as said third programming current a current equal to said second reference current when said disable signal is of said one state and a current $2^L$ times said second reference current when said disable signal is of said another state.

6. The apparatus of claim 5 further comprising fourth current multiplier means receiving said third programming current and said disable signal and producing as said fourth programming current a zero current when said disable signal is of said one state and a current $K+1$ times as great as said third programming current when said disable signal is of said another state.

* * * * *